(12) United States Patent
Fischer

(10) Patent No.: US 6,351,153 B1
(45) Date of Patent: Feb. 26, 2002

(54) PHASE DETECTOR WITH HIGH PRECISION

(75) Inventor: Michael C. Fischer, Palo Alto, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/698,100

(22) Filed: Oct. 30, 2000

(51) Int. Cl.[7] ................................................ H03D 3/00
(52) U.S. Cl. .............................. 327/2; 327/3; 327/10; 327/12
(58) Field of Search .............................. 327/2, 3, 7, 10, 327/12, 185

(56) References Cited

U.S. PATENT DOCUMENTS

| | | | | |
|---|---|---|---|---|
| 5,115,208 A | * | 5/1992 | Masdea et al. | 327/12 |
| 5,550,878 A | * | 8/1996 | Shigaki et al. | 327/12 |
| 5,592,125 A | * | 1/1997 | Williams | 327/12 |
| 5,619,171 A | * | 4/1997 | Rijckaert et al. | 327/12 |
| 5,668,838 A | * | 9/1997 | Nakamura et al. | 375/340 |
| 5,783,967 A | * | 7/1998 | Takaya | 329/303 |

* cited by examiner

*Primary Examiner*—Timothy P. Callahan
*Assistant Examiner*—An T. Luu

(57) ABSTRACT

A phase detector is disclosed that detects the phase of two inputs with precision. A method and apparatus of phase detecting that subtracts out common errors due to temperature variations and supply voltage fluctuations. The phase detector and method preferably utilize digital circuitry such as exclusive OR gates and differential amplifiers to perform the accurate phase detection. The inputs and outputs may be attenuated or filtered to produce the desired results.

15 Claims, 6 Drawing Sheets

```
┌─────────────────────────────────┐
│ Performing an XOR Operation on a│
│ First Input and a Second Input to│
│ Product a First Output          │
│ 41                              │
└─────────────────────────────────┘
              │
              ▼
┌─────────────────────────────────┐
│ Inverting the Second Input      │
│ 42                              │
└─────────────────────────────────┘
              │
              ▼
┌─────────────────────────────────┐
│ Performing an XOR Operation on the│
│ First Input and the Inverted Second│
│ Input to Produce a Second Output│
│ 43                              │
└─────────────────────────────────┘
              │
              ▼
┌─────────────────────────────────┐
│ Subtracting the Second Output From the│
│ First Output to Produce a Phase │
│ Indicating Voltage              │
│ 44                              │
└─────────────────────────────────┘
              │
              ▼
┌─────────────────────────────────┐
│ Measuring the Phase Indicating Voltage│
│ To Determine the Phase of the First│
│ Input and the Second Input      │
│ 45                              │
└─────────────────────────────────┘
```

PHASE DETECTOR WITH HIGH PRECISION

FIELD OF THE INVENTION

The field of the invention is digital circuitry, and more specifically high precision input characteristic detection circuitry.

BACKGROUND

Detecting the phase of two inputs has presented unique challenges. In the past, analog circuits have been utilized to detect the phase of two inputs. Specifically, analog mixers have been used for phase detection. Unfortunately, analog mixers are more expensive and less convenient than digital circuits. In some applications, analog mixers are simply impractical.

One digital circuit solution has been to use exclusive-OR ("XOR") gates as phase detectors. If the two inputs are in phase, the resulting output of the XOR gate is known to be a low level output (i.e., zero volts). Likewise, if the two inputs are one-hundred eighty degrees out of phase, the resulting output of the XOR gate is known to be a high level output. Unfortunately, the transducer gain and offset of these results are sensitive to variations of temperature and supply voltage. Consequently, the precision and accuracy of a XOR gate phase detector is lacking.

What is needed is a digital circuit phase detector that is precise and accurate and is not substantially susceptible to errors such as those caused by temperature or supply voltage variations.

SUMMARY OF THE INVENTION

The present invention is an apparatus and method for detecting phase with precision. In an embodiment, the present invention utilizes a pair of logic gates applied to two inputs to allow the inputs to be processed by a differential amplifier to determine the phase of the inputs. The pair of logic gates are preferably XOR gates that perform exclusive OR operations on the two inputs. The first XOR gate performs an exclusive OR operation on a first input and a second input. The second XOR gate performs an exclusive OR operation on the first input and the inverted second input. The outputs of the second XOR gate and the first XOR gate are then subtracted to remove any common errors, such as those caused by temperature and input voltage variation.

The result of the subtraction is a phase indicating voltage that is without these common errors. From known voltage levels of the phase indicating voltage, the phase of the first input and the second input can be determined. The phase indicating voltage is at a minimum level when the first input and the second input are zero degrees out of phase (i.e., in phase), a medium level when the first input and the second input are ninety degrees out of phase and a maximum level when the first input and the second input are one-hundred eighty degrees out of phase. Accordingly, the phase detection is accomplished with high precision and accuracy.

An embodiment of the present invention utilizes two additional XOR gates. The third XOR gate is used to insert a propagation delay into the second input. This propagation delay is inserted to match the propagation delay caused by the fourth XOR gate which is used to invert the second input. The outputs of the third XOR gate and the fourth XOR gate are transmitted to the first XOR gate and the second XOR gate, respectively, for the exclusive OR operations with the first input. Use of four XOR gates is particularly convenient since XOR gates are often sold in packages of four gates.

In a preferred embodiment, the desired output of a phase detector is a low frequency average voltage resulting from lowpass filtering of the XOR gate output waveforms. This filtering may be inserted after each gate before a differential amplifier which may perform the subtracting of the waveforms or the differential amplifier may provide some or all of this filtering, either by its own characteristics or by appropriate feedback components, or the differential amplifier may be followed by a lowpass filter. In the embodiment shown, two capacitors are associated with the differential amplifier for this purpose.

BRIEF DESCRIPTION OF THE FIGURES

FIG. 4 is a flowchart of a method of the present invention.

DETAILED DESCRIPTION OF THE INVENTION

Figure 1:
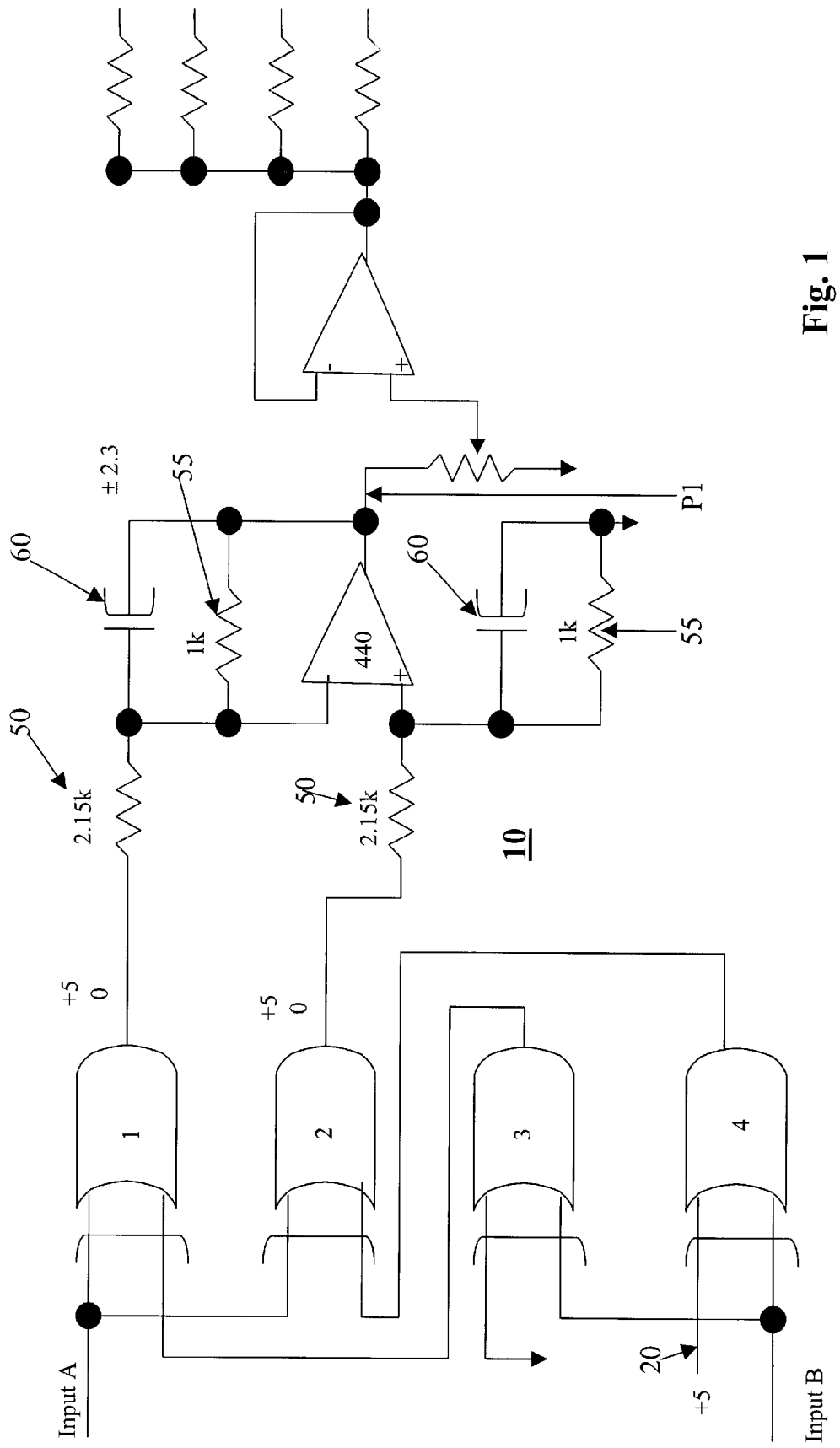
FIG. 1 is a block diagram of circuitry of an embodiment of the present invention.

FIG. 1 illustrates an exemplary embodiment of the Phase Detector with High Precision 10 of the present invention. The embodiment shown utilizes exclusive OR ("XOR") logic gates in combination with a differential amplifier to precisely determine the phase difference, as an analog signal, of two measured digital waveform inputs. Since logic gates are used, the input signals need to be logic level signals as opposed to analog signals. If the inputs are analog signals, hard limiters would need to be applied to the analog signals.

Figure 2A:
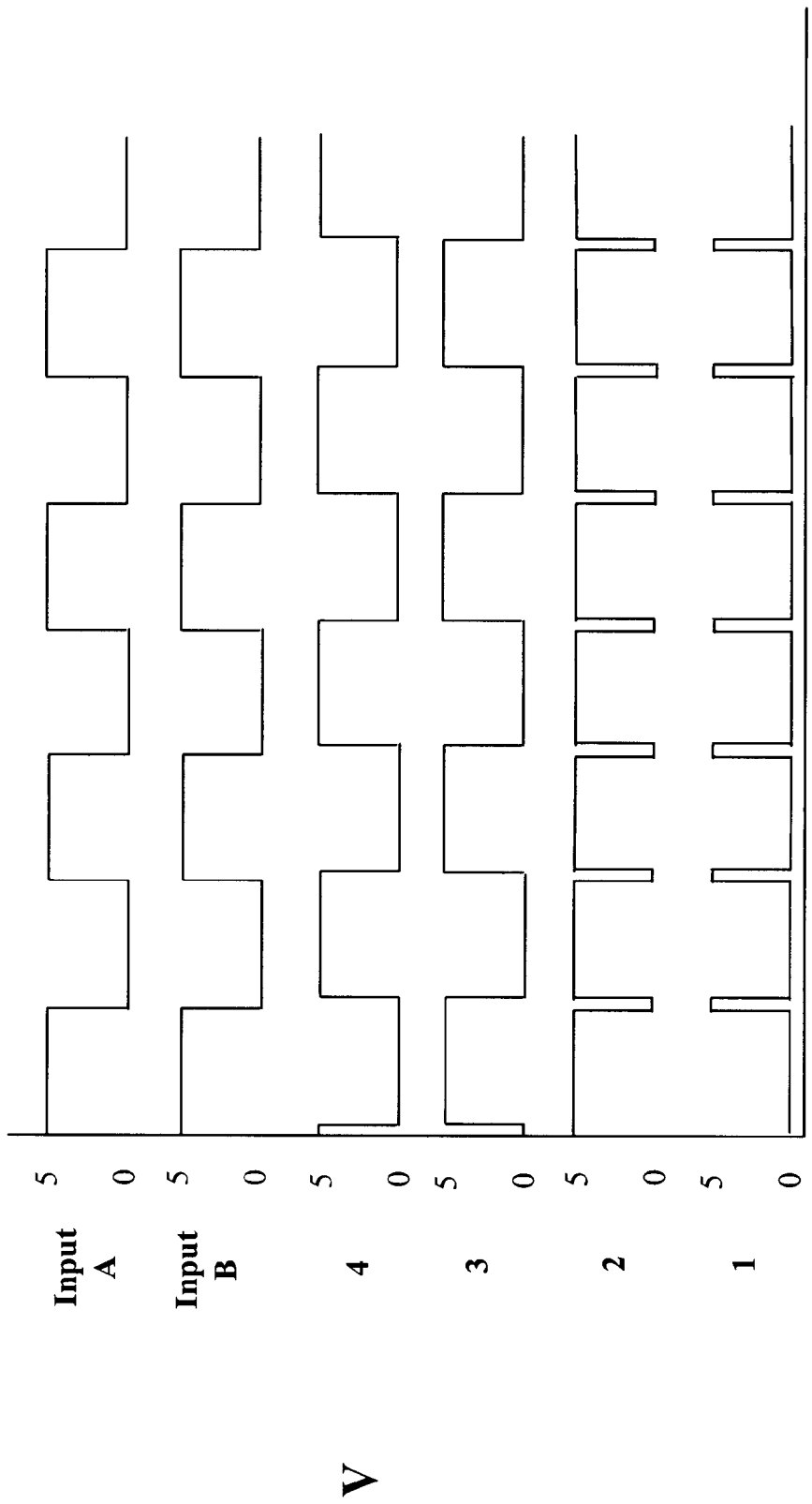
FIGS. 2a–2c illustrate sample input wave forms and the function of circuitry of an embodiment of the present invention.
Figure 2B:
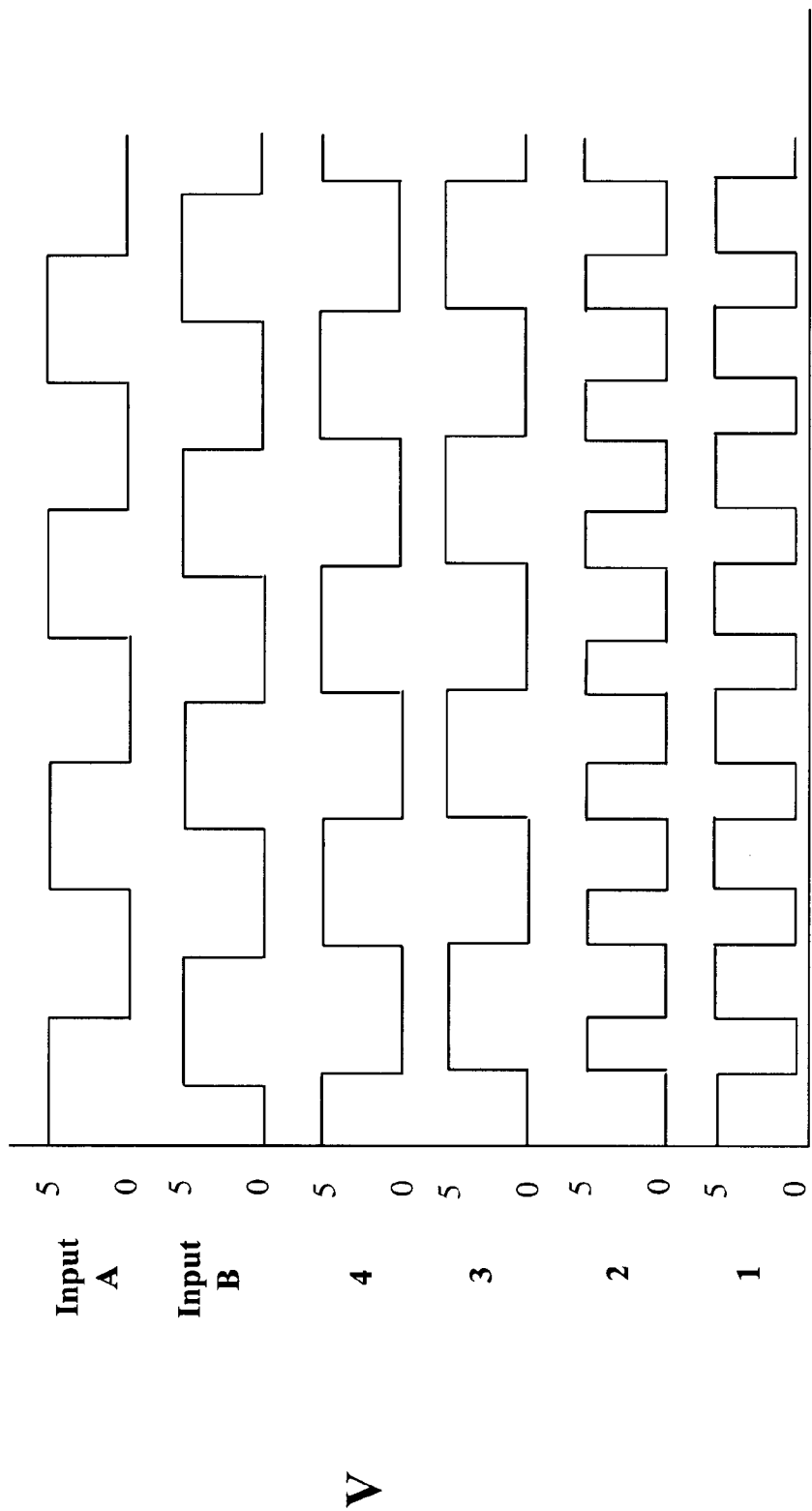
Figure 2C:
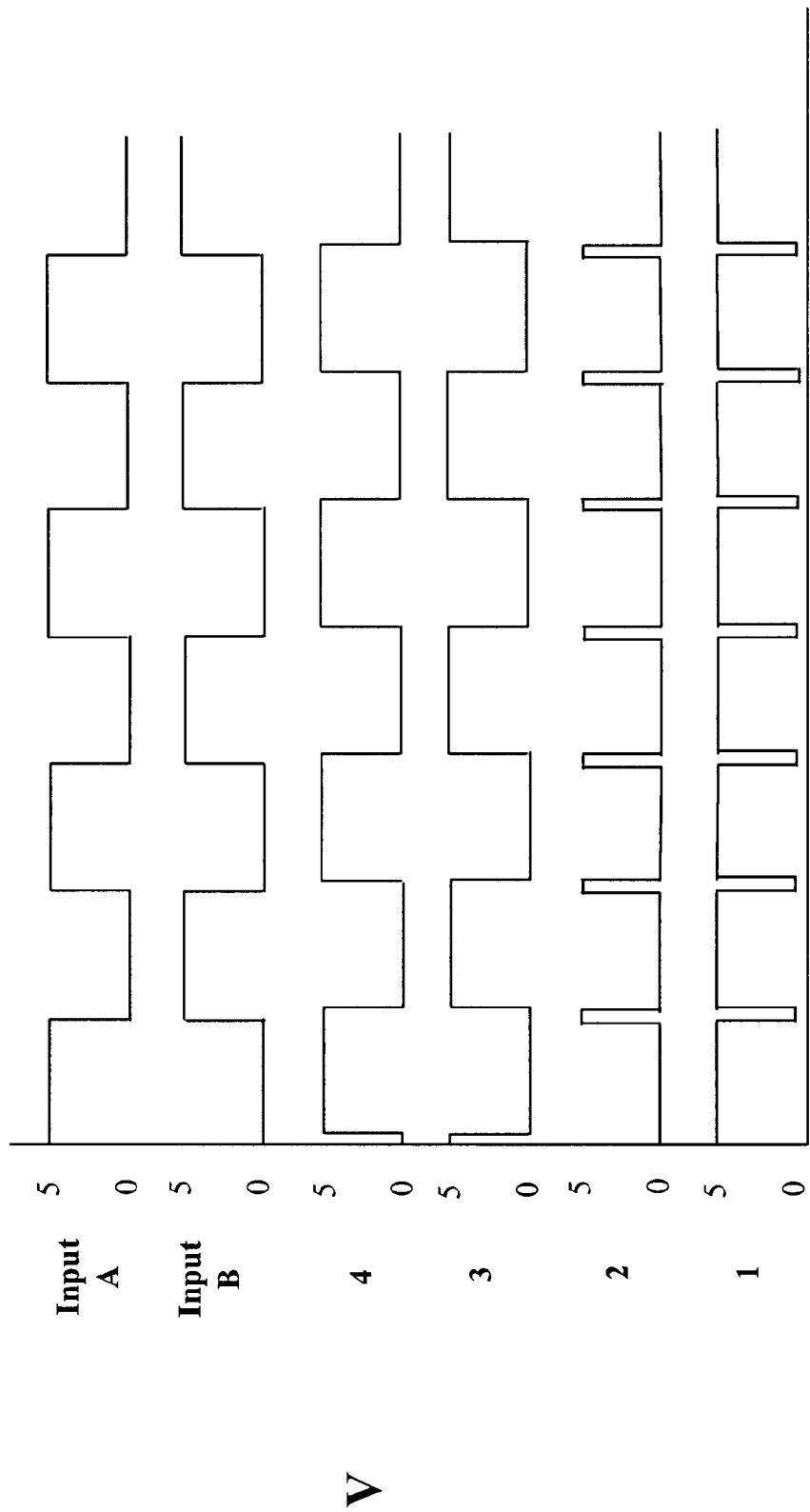

The two input signals in this embodiment are Input A and Input B. In the example shown, Input A and B are both 5 volt square waves with a fifty-percent (50%) duty cycle. The input signals are largely determined by the application in which the present invention is used. Accordingly, a variety of voltages, waveforms and duty-cycles may be used. FIGS. 2a–2c illustrate various Input A and B signals.

As shown in FIG. 1, Inputs A and B are applied to four XOR logic gates. The four XOR logic gates are labeled 1–4. XOR gates 1 and 2 compare Input A and Input B as modified by XOR gates 3 and 4. XOR gate 4 performs an exclusive OR operation on Input B and a constant high-level input 20. The constant high-level input 20 voltage is preferably equal to the high-level voltage of Input B. Accordingly, in the present embodiment, the constant high-level input 20 is 5 volts. As a result, the output of XOR gate 4 is low (i.e., 0 volts), after an inherent propagation delay, when Input B is high (i.e., 5 volts). Likewise, the output of XOR gate 4 is high (i.e., 5 volts), after the inherent delay, when Input B is low (i.e., 0 volts). In other words, XOR gate 4 inverts and delays Input B. Referring to FIGS. 2a–2c, the output of XOR gate 4 is seen with the inherent delay effect. The output of XOR gate 4 is input to XOR gate 2.

Since the output of XOR gate 4 includes an inherent delay, Input B must also be delayed before being input into XOR gate 1. Accordingly, XOR gate 3 performs an exclusive OR operation on Input B and a ground input 25. The output of XOR gate 3 is Input B with an inherent propagation delay that preferably matches the inherent propagation delay caused by XOR gate 4, as seen in FIGS. 2a–2c. The output of XOR gate 3 is input to XOR gate 1.

XOR gate 1 performs an exclusive OR operation on Input A and the output of XOR gate 3 (i.e., Input B with the inherent delay from XOR gate 3). Accordingly, the output of XOR gate 1 is low, with an inherent delay, when Input A and the output of XOR gate 3 are both high (e.g., 5 volts) or both low (e.g., 0 volts). As such, if the phases of Input A and Input B are the same (i.e., zero degrees (0°) out of phase), then the output of XOR gate 1 will be constantly low, except for a brief pulse due to the delay caused by XOR gate 3. Such a situation is illustrated in FIG. 2a. In FIG. 2a, Input A and Input B are zero degrees out of phase, and therefore, the output of XOR gate 1 is low, except for the aforementioned pulse.

Oppositely, if Input A and Input B are one-hundred eighty degrees (180°) out of phase, then the output of XOR gate 1 will be constantly high, except for a brief pulse due to the delay caused by XOR gate 3. FIG. 2c illustrates this situation and result. On the other hand, when Input A and Input B are ninety degrees (90°) out of phase, the output of XOR gate 1 will be alternatively high and low, with a smaller duty cycle and narrower wave form then Input A and Input B. FIG. 2b illustrates this situation and result.

Figure 3:
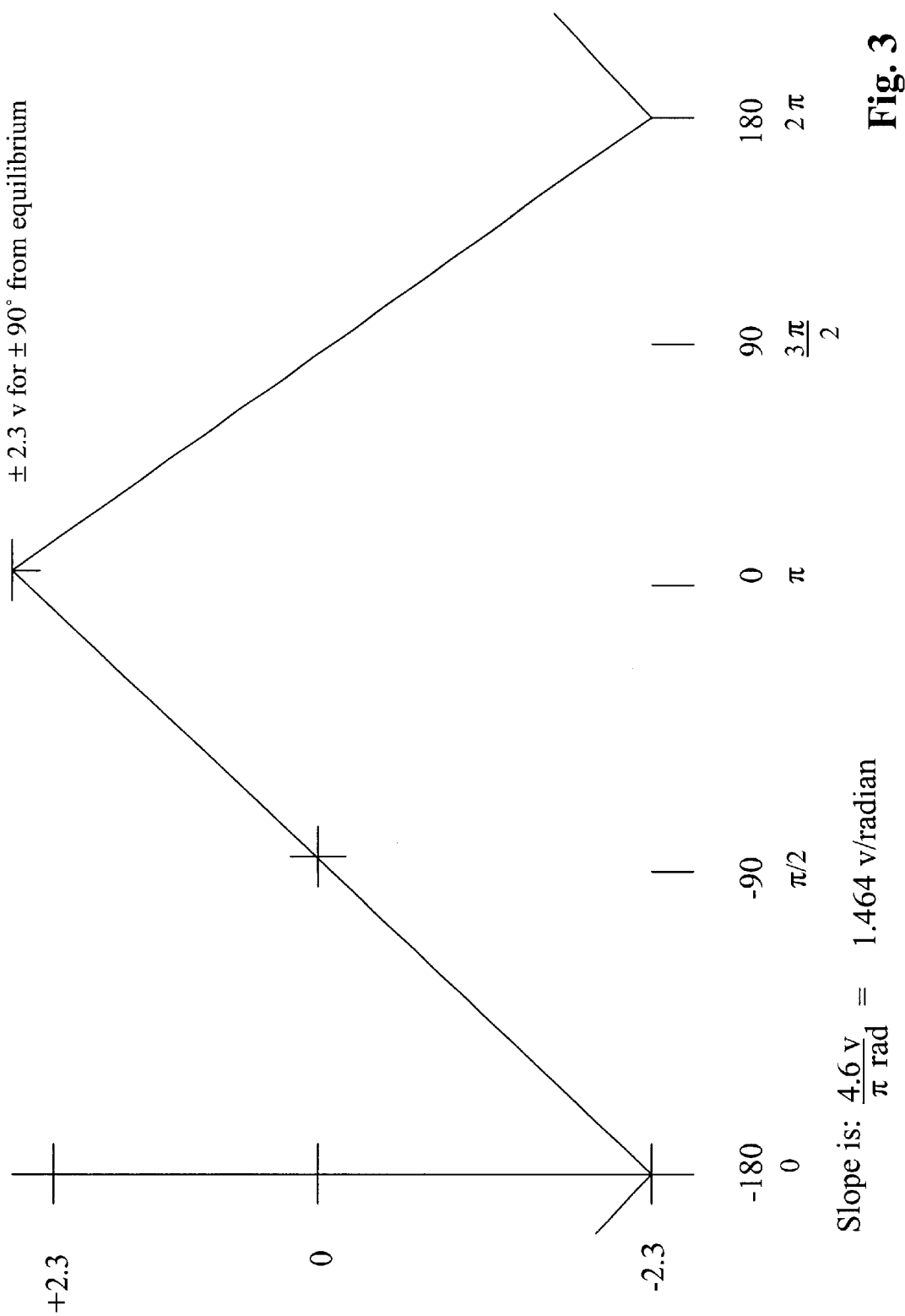
FIG. 3 is a diagram of a phase indicating voltage of an embodiment of the present invention over a range of phases.

Referring to FIG. 3, we see that the above results correspond with the phase diagram shown. A minimum output is seen at a phase angle of one-hundred eighty degrees (i.e., when Input A and Input B are 180° out of phase), a middle output is seen at a phase angle of ninety degrees (ie., when Input A and Input B are 90° out of phase) and a maximum output is seen at a phase angle of zero degrees (i.e., when Input A and Input B are 0° out of phase). A phase lock loop would track as shown in FIG. 3 if the phase detector 10 were used as the phase detector in the phase lock loop.

XOR gate 1, with inputs from Input A and Input B, may be used by itself as a phase detector. However, if a logic gate such as XOR gate 1 is used as a phase detector, the DC level of the output of the logic gate will be subject to variations, particularly due to temperature and to some extent due to the supply voltage on the logic gate. One way to minimize these errors is to provide a second section with an output of the complementary function to XOR gate 1 and to subtract the outputs of XOR gate 1 and the second section. A differential amplifier may be used to combine and subtract these outputs. So subtracted, common variations, such as from temperature or supply voltage changes, will tend to be subtracted or canceled out by the differential amplifier. Consequently, the phase detector will have improved stability, with regards to temperature and supply voltage, in comparison to the single logic gate phase detector.

It follows then that XOR gate 2 performs an exclusive OR on Input A and the output of XOR gate 4 (i.e., inverted Input B with an inherent delay caused by XOR gate 4). Accordingly, the output of XOR gate 2 is low, with an inherent delay, when Input A and the output of XOR gate 4 are both high (e.g., 5 volts) or both low (e.g., 0 volts). As such, if the phases of Input A and Input B are the same (i.e., zero degrees (0°) out of phase), then the output of XOR gate 2 will be constantly high (since the output of XOR gate 4 will be the opposite of Input A, with a delay), except for a brief pulse due to the delay caused by XOR gate 4. Such a situation is illustrated in FIG. 2a. In FIG. 2a, Input A and Input B are zero degrees out of phase, and therefore, the output of XOR gate 2 is high, except for the aforementioned pulse.

Oppositely, if Input A and Input B are one-hundred eighty degrees (180°) out of phase, then the output of XOR gate 2 will be constantly low (since the output of XOR gate 4 will be the same as Input A, with a delay), except for a brief pulse due to the delay caused by XOR gate 4. FIG. 2c illustrates this situation and result. On the other hand, when Input A and Input B are ninety degrees (90°) out of phase, the output of XOR gate 2 will be alternatively high and low, with a smaller duty cycle and narrower wave form then Input A and Input B. FIG. 2b illustrates this situation and result.

As discussed above, the outputs of XOR gate 1 and XOR gate 2 are combined and subtracted by a differential amplifier 440. The differential amplifier 440 will subtract out errors common to both XOR gate 1 and XOR gate 2. As is shown in FIG. 1, the output of XOR gate 2 is input into the positive input ("+") of the differential amplifier 440 and the output of XOR gate 1 is input into the negative input ("−") of the differential amplifier 440. Consequently, errors common to both outputs will be treated oppositely by the differential amplifier 440 (i.e., they will be positive for one input and negative for the other input) and will therefore cancel out. For example, an error of 0.01 volts caused by a voltage supply shift common to both XOR gate 1 and XOR gate 2 will be treated as −0.01 volts in the −input and as 0.01 volts in the +input, therefore resulting in a net zero volt effect (0.01−0.01=0) on the output of the differential amplifier 440.

The differential amplifier 440 and its surrounding components (e.g. the input resistors 50, resistors 55 and capacitors 60) may be designed to attenuate, filter and, as stated above, subtract the XOR gate 1 and XOR gate 2 outputs. The outputs may be attenuated to provide a voltage level appropriate for the application in which the phase detector is used. Low-pass filtering of the XOR gate outputs may be utilized to achieve a desired low frequency average voltage for the phase detector output. This low-pass filtering may be inserted after each gate before the amplifier 440, the amplifier 440 may provide some or all of this filtering, either by its own characteristics or by appropriate feedback and other components, or the amplifier 440 may be followed by a low-pass filter. If a different frequency average voltage for the phase detector output is desired, different filtering may be utilized.

In the present embodiment, the outputs of XOR gate 1 and XOR gate 2 are both attenuated by input resistors 50 and resistors 55. In the example shown in FIG. 1, the input resistors 50 are 2.15 kΩ resistors and the resistors 55 are 1.0 kΩ resistors. Consequently, the outputs of XOR gate 1 and XOR gate 2 are attenuated by a factor of 2.15 (i.e., 2.15 kΩ/1.00 kΩ). With an input of 5 volts, as in the present example, the attenuation of 2.15 produces an output range for the differential amplifier 440 of approximately −2.32 volts to 2.32 volts.

Likewise, the outputs of XOR gate 1 and XOR gate 2 are low-pass filtered by the differential amplifier 440 and the surrounding components in the present embodiment. The capacitors 60, in cooperation with the resistors 55, function as low pass filters that cause the low-frequency averages of the pulse waveform outputs from XOR gate 1 and XOR gate 2 to be combined differentially in the differential amplifier 440. As is shown in FIG. 3, the low-pass filtering of the XOR gate 1 and XOR gate 2 outputs produces a constant phase indicating voltage P1 at each phase, averaging out the brief pulses shown in FIGS. 2a and 2c.

The resultant output P1 of the differential amplifier 440 is illustrated by FIG. 3. As discussed above, when Input A and Input B are one-hundred eighty degrees (180°) out of phase, the output P1 is at a minimum. The minimum output, ∼−2.32 volts, is a result of the combined low frequency average of the nearly constant high output of XOR gate 1 and the nearly constant low, or zero, output of XOR gate 2, as discussed above and as seen in FIG. 2c. Further, when Input A and Input B are ninety degrees (90°) out of phase, the output P1 is at a medium level. The medium output, 0 volts, is a result of the combined low frequency average of the outputs of XOR gate 1 and XOR gate 2 that are constantly oppositely high and low, as discussed above and as seen in FIG. 2b. Finally, when Input A and Input B are zero degrees (0°) out of phase, the output P1 is at a maximum. The maximum output, ~2.32 volts is a result of the combined low frequency average of the nearly constant high output of XOR gate 2 and the nearly constant low, or zero, output of XOR gate 1, as discussed above and as seen in FIG. 2a.

As a result, the phase indicating voltage in the present embodiment, i.e., output P1, has a zero-center, bi-polar range that is convenient for many applications. Consequently, with the known range, the phase of Input A and Input B can be determined from the output voltage of output PI. The rate of change in output P1 per radian change in the phase of Input A and Input B can also be determined by calculating the slope of P1 in FIG. 3. In the present example, the slope is approximately 4.64 volts per π radian (π radian=180°) or approximately 1.464 volts/radian.

A phase detection method 40 according to the present invention is illustrated in FIG. 4. The method 40 comprises performing an XOR operation on a first input and a second input to produce a first output 41, inverting the second input 42, performing an XOR operation on the first input and the inverted second input to produce a second output 43, subtracting the second output from the first output to produce a phase indicating voltage 44 and measuring the phase indicating voltage to determine the phase of the first input and the second input 45, wherein the phase indicating voltage is at a maximum when the first input and the second input are zero degrees out of phase and at a minimum when the first input and the second input are one-hundred eighty degrees out of phase. As described above, the method may also include delaying the second input and the inverted second input (not shown in FIG. 4), attenuating the first output and the second output (not shown in FIG. 4) and low-pass filtering the first output and the second output (not shown in FIG. 4), as well as other steps that are apparent from the above description and Figures.

The Phase Detector and the method of phase detection described above may be used in a variety of applications requiring phase detection. The additional circuitry shown in FIG. 3 is for a particular implementation and is not required by the present invention. For example, the variable resistor shown following the differential amplifier 440 may be used to adjust the slope or transducer gain of this phase detection process. While the invention has been described with reference to the exemplary embodiments thereof, those skilled in the art will be able to make various modifications to the described embodiments of the invention without departing from the true spirit and scope of the invention. The terms and descriptions used herein are set forth by way of illustration only and are not meant as limitations. In particular, although the method of the present invention has been described by examples, the steps of the method may be performed in a different order than illustrated or simultaneously. Those skilled in the art will recognize that these and other variations are possible within the spirit and scope of the invention as defined in the following claims and their equivalents.

What is claimed is:

1. A phase detector with high precision, comprising:
   a first input, wherein the first input has a high level and a low level;
   a second input, wherein the second input has a high level and a low level;
   a first circuitry that delays the second input and transmits a delayed second input;
   a first XOR gate that performs an exclusive OR operation on the first input and the delayed second input to produce a first output;
   a second circuitry that delays and inverts the second input and transmits a delayed, inverted second input;
   a second XOR gate that performs an exclusive OR operation on the first input and the delayed, inverted second input to produce a second output; and
   a differential amplifier that subtracts the second output from the first output to produce a phase indicating voltage, wherein the phase indicating voltage is at a maximum when the first input and the second input are zero degrees out of phase and the phase indicating voltage is at a minimum when the first input and the second input are one-hundred eighty degrees out of phase.

2. The phase detector of claim 1, wherein the first input and the second input are square wave forms.

3. A phase detector with high precision, comprising:
   a first input, wherein the first input has a high level and a low level;
   a second input, wherein the second input has a high level and a low level;
   a first XOR gate that performs an exclusive OR operation on the first input and a delayed second input to produce a first output;
   a second XOR gate that performs an exclusive OR operation on the first input and a delayed, inverted second input to produce a second output;
   a third XOR gate that delays the second input and transmits the delayed second input to the first XOR gate; and
   a fourth XOR gate that delays and inverts the second input and transmits the delayed, inverted second input to the second XOR gate, and
   a differential amplifier that subtracts the second output from the first output to produce a phase indicating voltage, wherein the phase indicating voltage is at a maximum when the first input and the second input are zero degrees out of phase and the phase indicating voltage is at a minimum when the first input and the second input are one-hundred eighty degrees out of phase.

4. The phase detector of claim 3, wherein the third XOR gate performs an exclusive OR operation on the second input and a grounded input.

5. The phase detector of claim 3, wherein the fourth XOR gate performs an exclusive OR operation on the second input and a high level input that has a voltage equal to the second input high level.

6. The phase detector of claim 1, further comprising input resistors that attenuate the first output and the second output.

7. The phase detector of claim 1, further comprising one or more capacitors and one or more resistors applied to the first output and the second output.

8. The phase detector of claim 1, wherein the high level of the first input and the second input is five volts and the low level of the first input and the second input is zero volts.

9. The phase detector of claim 1, further comprising one or more low-pass filters that filter the first output and the second output so that the differential amplifier subtracts a low-frequency average of the first output and the second output.

10. A method of phase detection with high precision, comprising:
   providing a first input and a second input;
   delaying the second input to produce a delayed second input;
   delaying and inverting the second input to produce a delayed, inverted second input;
   performing an XOR operation on a first input and the delayed second input to produce a first output;
   performing an XOR operation on the first input and the delayed, inverted second input to produce a second output; and
   subtracting the second output from the first output to produce a phase indicating voltage and measuring the phase indicating voltage to determine the phase of the first input and the second input, wherein the phase indicating voltage is at a maximum when the first input and the second input are zero degrees out of phase and at a minimum when the first input and the second input are one-hundred eighty degrees out of phase.

11. The method of claim 10, wherein the delayed second input and the delayed, inverted second input are delayed for the same period of time.

12. The method of claim 10, further comprising attenuating the first output and the second output.

13. The method of claim 10, wherein a differential amplifier performs the subtracting step.

14. The method of claim 10, further comprising low-pass filtering the first output and the second output so that the subtracting step comprises subtracting the low-frequency average of the first output and the second output.

15. A phase detector with high precision, comprising:
   a first input, wherein the first input has a high level and a low level;
   a second input, wherein the second input has a high level and a low level;
   means for delaying the second input, wherein the means for delaying transmits a delayed second input;
   a first XOR gate that performs an exclusive OR operation on the first input and the delayed second input to produce a first output;
   means for delaying and inverting the second input, wherein the means for delaying and inverting transmits a delayed, inverted second input;
   a second XOR gate that performs an exclusive OR operation on the first input and the delayed, inverted second input to produce a second output; and
   a differential amplifier that subtracts the second output from the first output to produce a phase indicating voltage, wherein the phase indicating voltage is at a maximum when the first input and the second input are zero degrees out of phase and the phase indicating voltage is at a minimum when the first input and the second input are one-hundred eighty degrees out of phase.

* * * * *